(12) United States Patent
Takahashi et al.

(10) Patent No.: US 8,318,393 B2
(45) Date of Patent: Nov. 27, 2012

(54) OPTICAL-IMAGE-INTENSITY CALCULATING METHOD, PATTERN GENERATING METHOD, AND MANUFACTURING METHOD OF SEMICONDUCTOR DEVICE

(75) Inventors: Masanori Takahashi, Kanagawa (JP); Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/960,074

(22) Filed: Dec. 3, 2010

(65) Prior Publication Data

US 2011/0151361 A1 Jun. 23, 2011

(30) Foreign Application Priority Data

Dec. 17, 2009 (JP) .................................. 2009-286973

(51) Int. Cl.
*G03F 9/00* (2006.01)
(52) U.S. Cl. ............... 430/30; 430/5; 430/311; 382/144
(58) Field of Classification Search ............... 430/5, 30, 430/311; 382/144
See application file for complete search history.

(56) References Cited

FOREIGN PATENT DOCUMENTS

| JP | 5-47623 | 2/1993 |
|---|---|---|
| JP | 2007-122025 | 5/2007 |
| JP | 2007-324479 | 12/2007 |
| JP | 2008-47873 | 2/2008 |
| JP | 2008-122929 | 5/2008 |
| JP | 2008-218747 | 9/2008 |

OTHER PUBLICATIONS

Lohmann, A. W., "Image Rotation, Wigner Rotation, and the Fractional Fourier Transform," J. Opt. Soc. Am. A, vol. 10, No. 10., pp. 2181-2186, (Oct. 1993).

*Primary Examiner* — Christopher Young
(74) *Attorney, Agent, or Firm* — Finnegan, Henderson, Farabow, Garrett & Dunner, L.L.P.

(57) ABSTRACT

According to the embodiment, an optical image intensity distribution to be formed in a resist arranged on a lower layer side of a diffraction pattern is calculated by performing a whole image exposure from an upper surface side of the diffraction pattern formed on a substrate. The optical image intensity distribution is calculated by using a multimode waveguide analysis model or a fractional Fourier transform with respect to the diffraction pattern.

20 Claims, 5 Drawing Sheets

OPTICAL-IMAGE-INTENSITY CALCULATING METHOD, PATTERN GENERATING METHOD, AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2009-286973, filed on Dec. 17, 2009; the entire contents of which are incorporated herein by reference.

FIELD

The present embodiment typically relates to an optical-image-intensity calculating method, a pattern generating method, and a manufacturing method of a semiconductor device.

BACKGROUND

In a lithography process when manufacturing a semiconductor device, a mask (reticle) that is four times in size of a pattern that is actually formed and an exposure apparatus composed of a reduction projection optical system are used for forming a fine pattern.

However, recently, with the miniaturization of a pattern, formation of a mask pattern is becoming difficult even by using a quadruple mask. Moreover, because of a physical limit of a member and a design of an optical system, a size of a pattern formable on a wafer is approaching the limit. As a Resolution Enhancement Techniques (RET) to address such a problem, a novel exposure technique such as a double patterning is proposed. This double patterning has many problems that need to be solved such as displacement that occurs when superimposing the first exposure with the second exposure, so that pattern formation is not easy. Therefore, it is desired to correctly calculate an optical image intensity distribution formed by whole image exposure in a short time for forming a desired fine pattern.

DETAILED DESCRIPTION

According to an embodiment, an optical image intensity distribution to be formed in a resist arranged on a lower layer side of a diffraction pattern is calculated by performing a whole image exposure from an upper surface side of the diffraction pattern formed on a substrate. The optical image intensity distribution is calculated by using a multimode waveguide analysis model or a fractional Fourier transform with respect to the diffraction pattern.

An optical-image-intensity calculating method, a pattern generating method, and a manufacturing method of a semiconductor device according to the embodiment will be explained below in detail with reference to the accompanying drawings. The present invention is not limited to this embodiment.

Embodiment

In the present embodiment, a resist layer and a diffraction pattern that diffracts exposure light are formed on an upper layer side of a layer (pattern forming layer) on which a desired pattern formation is performed, and a whole image exposure is performed from above the diffraction pattern. Then, an optical image intensity distribution formed in the resist layer when the whole image exposure is performed from above the diffraction pattern is simulated by using a multimode waveguide analysis method or a fractional FFT (Fast Fourier Transform) (fractional Fourier transform) to the diffraction pattern. Moreover, the diffraction pattern (mask pattern used for generating the diffraction pattern) or the like is corrected so that the optical image intensity distribution formed in the resist layer becomes a distribution with which a desired pattern can be formed. In other words, the diffraction pattern or the like is corrected so that a resist pattern to be formed has a desired shape. Whereby, various patterns with desired dimensions that are finer than the diffraction pattern of the upper layer are formed.

Figure 1:
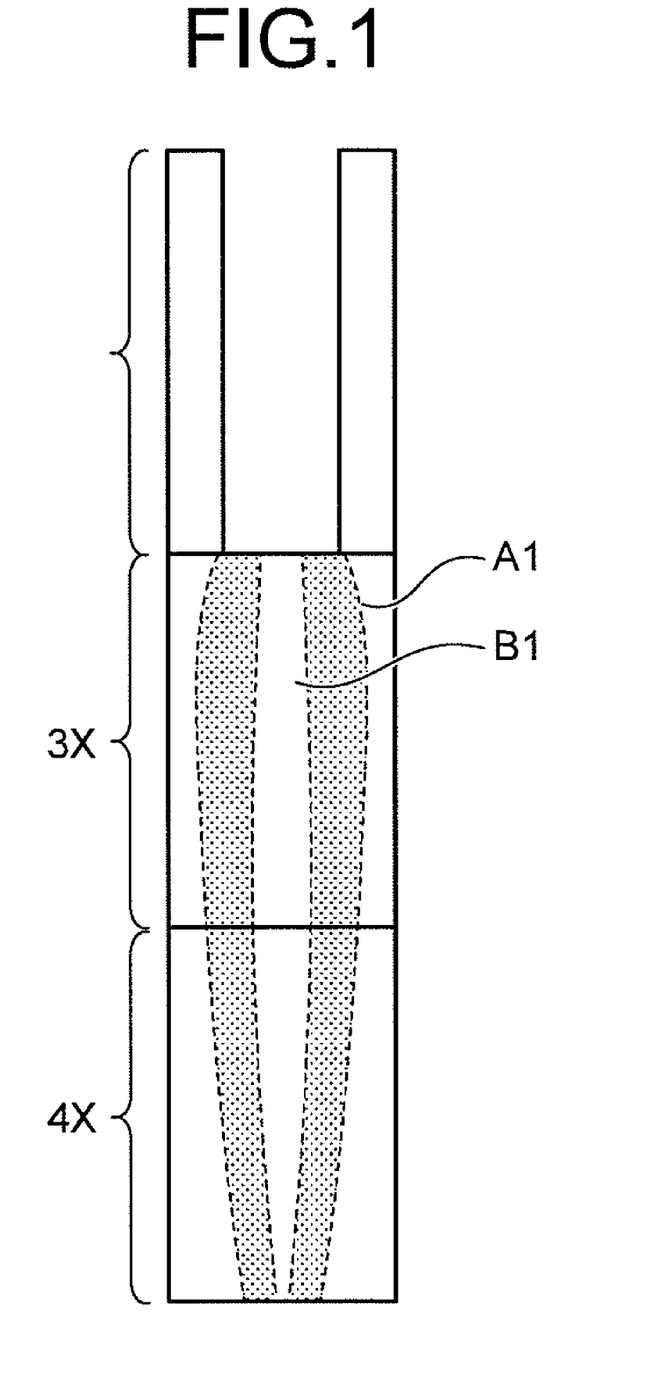
FIG. 1 is a cross-sectional view illustrating a configuration of a diffraction pattern and a resist layer.

FIG. 1 is a cross-sectional view illustrating the configuration of the diffraction pattern and the resist layer. On a substrate (not shown) such as a wafer, a pattern forming layer 4X on which a pattern formation is performed is laminated and a resist layer 3X is laminated on the upper layer side of the pattern forming layer 4X. Moreover, a diffraction pattern (initial pattern) 10 that functions as a diffraction grating is formed on the upper layer side of the resist layer 3X.

In the present embodiment, when forming a desired pattern on the pattern forming layer 4X, the whole image exposure is performed from the upper layer side of the diffraction pattern 1C. At this time, a photomask or the like is not needed because of the whole image exposure, and illumination for exposure is emitted to the substrate (upper layer side of the diffraction pattern 1C) without via the photomask.

Moreover, in the whole image exposure, exposure needs to be performed under the condition in which a diffraction phenomenon occurs. The condition in which the diffraction phenomenon occurs is, for example, a condition in which a pattern pitch p of the diffraction pattern 1C is larger than (wavelength $\lambda$ of exposure light in whole image exposure)/(refractive index n of diffraction pattern with respect to exposure light in whole image exposure) ($p > \lambda/n$). For example, when EUV is used in the whole image exposure, the refractive index n can be assumed to be approximately one, so that the whole image exposure is performed with the exposure light whose wavelength is shorter than the dimension of the pitch of the diffraction pattern 1C.

Furthermore, a minimum pattern pitch of the diffraction pattern 1C depends on a wavelength of the exposure light used when forming the diffraction pattern 1C. Therefore, as the exposure light used in the whole image exposure, it is desired to use the exposure light having a wavelength shorter than the wavelength of the exposure light used when forming the diffraction pattern 1C. For example, when i line (wavelength is 365 nm) is used in forming the diffraction pattern 1C, the whole image exposure is performed by using KrF excimer laser (wavelength is 248 nm), ArF excimer laser (wavelength is 193 nm), F2 excimer laser (wavelength is 157 nm), EUV (Extreme Ultraviolet Lithography) (wavelength is 13.6 nm), or the like whose wavelength is shorter than this i line. In the formation of the diffraction pattern 1C and the whole image exposure, immersion exposure or electron beam can be used. In the present embodiment, the case is explained in which the diffraction pattern 1C is formed by using ArF excimer laser and the whole image exposure is performed by using EUV.

When the whole image exposure is performed from above the diffraction pattern 1C, the light intensity distribution (optical image intensity distribution) of an optical image formed in a film of the resist layer 3X and the pattern forming layer 4X appears. In FIG. 1, in the optical image intensity distribution, an area in which the optical image intensity distribution is weak is indicated as a low intensity area A1 and an area in which the optical image intensity distribution is strong is indicated as a high intensity area B1. The low intensity area A1 is an area in which the intensity distribution of light becomes weak by diffraction of the exposure light by the diffraction pattern 1C and the high intensity area B1 is an area in which the intensity distribution of light becomes strong by diffraction of the exposure light by the diffraction pattern 1C.

The resist pattern is formed on the resist layer 3X out of the resist layer 3X and the pattern forming layer 4X by a development process after the exposure. When the resist layer 3X is a positive resist, the resist pattern remains by the development process after the exposure in the low intensity area A1 of the resist layer 3X and the resist pattern is removed by the development process after the exposure from the high intensity area B1 of the resist layer 3X. Specifically, a lower layer portion of the low intensity area A1 in the pattern forming layer 4X becomes a pattern forming area such as a line pattern and a lower layer portion of the high intensity area B1 in the pattern forming layer 4X becomes a space area.

After performing the development process on the resist layer 3X, the pattern forming layer 4X is etched with the resist layer 3X (resist pattern) after the development as a mask, so that a desired pattern is formed on the pattern forming layer 4X.

Next, a pattern forming method to the pattern forming layer 4X is explained. FIGS. 2A to 2I are diagrams illustrating a pattern forming process procedure to the pattern forming layer. FIGS. 2A to 2I illustrate cross sections of the substrate.

Figure 2A:
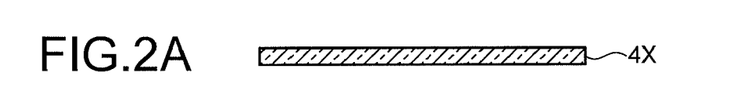
FIGS. 2A to 2I are diagrams illustrating a pattern forming process procedure to a pattern forming layer.
Figure 2B:
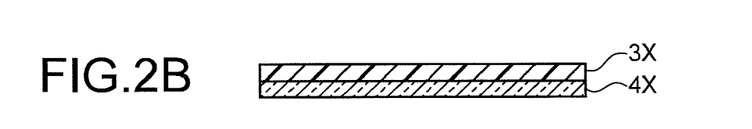

As shown in FIG. 2A, the substrate (the pattern forming layer 4X) is prepared and the first resist layer 3X is laminated on the pattern forming layer 4X as shown in FIG. 2B. This first resist layer 3X is a resist layer that is thereafter subjected to the whole image exposure. The pattern forming layer 4X is not limited to a semiconductor substrate and can be any layer such as a metal layer and a dielectric layer.

Figure 2C:
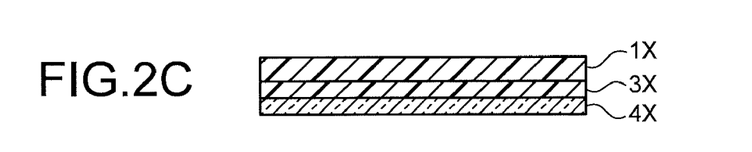

After laminating the resist layer 3X on the pattern forming layer 4X, as shown in FIG. 2C, a mask material, for example, a second resist layer 1X is laminated on the upper layer side of the resist layer 3X. This second resist layer 1X is a resist layer used for formation of the diffraction pattern 1C.

Figure 2D:
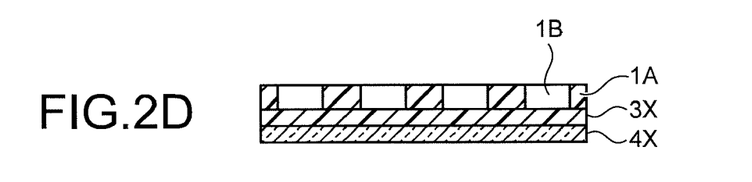

After laminating the second resist layer 1X on the upper layer side of the resist layer 3X, as shown in FIG. 2D, exposure (for example, exposure with ArF excimer laser) to the second resist layer 1X is performed. This exposure to the second resist layer 1X is exposure using a photomask and a projection optical system. Whereby, in the second resist layer 1X, a position (pattern 1A) corresponding to a shielding portion of the photomask is not exposed and a position (pattern 1B) of a light transmitting portion is exposed.

Figure 2E:
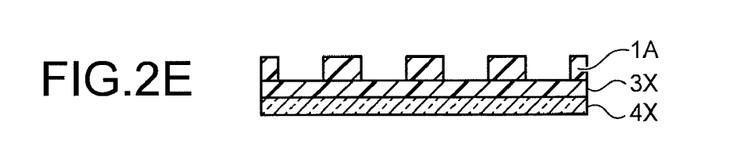
Figure 2F:
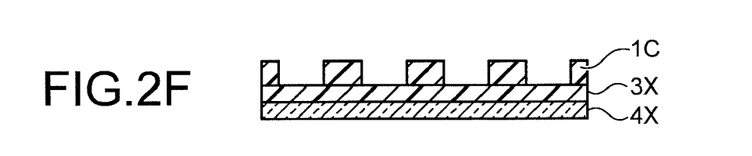

After exposing the second resist layer 1X, as shown in FIG. 2E, development is performed and further PEB (Post Exposure Bake) is performed as shown in FIG. 2F. With the development, only the pattern 1A remains and the pattern 1B is removed. Moreover, the pattern 1A is cured by the PEB to be the diffraction pattern 1C. The diffraction pattern 1C can be the resist pattern after the development or a mask material pattern (post-etching pattern) that is etched by using the resist pattern after the development. In this case, the mask material is formed on the upper layer side of the resist layer 3X and further the resist pattern is formed on the upper layer, and the mask material is etched with the resist pattern as a mask to form the mask material pattern. Moreover, the diffraction pattern 1C can be a pattern formed by nanoimprint or can be a pattern formed by using a sidewall process. When forming the mask material pattern by using the sidewall process, the mask material pattern is formed on a side wall of a core material pattern formed as a core material by lithography, so that it is possible to form the mask material pattern having a pitch more than double of exposure limit.

Figure 2G:
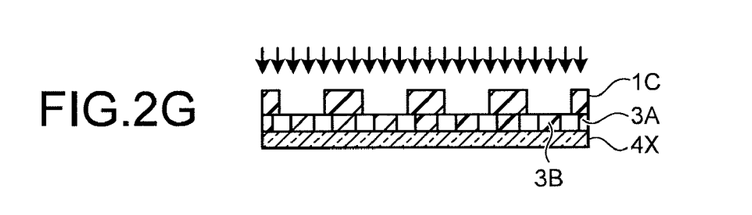

Thereafter, as shown in FIG. 2G, the whole image exposure is performed from the upper surface side of the diffraction pattern 1C. At this time, the whole image exposure (for example, whole image exposure with EUV) is performed with the exposure light whose wavelength is shorter than the wavelength used when exposing the second resist layer 1X. Whereby, in the first resist layer 3X, a predetermined position (position of a resist pattern 3A to be described later) in accordance with the diffraction pattern 1C is not exposed and a position (removing pattern 3B) other than the resist pattern 3A is exposed. In other words, in the resist layer 3X shown in FIG. 1, the position to be the low intensity area 1A becomes the resist pattern 3A and the position to be the high intensity area B1 becomes the removing pattern 3B.

Figure 2H:
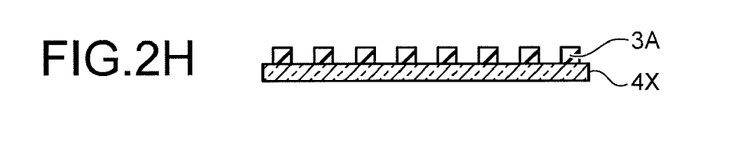
Figure 2I:
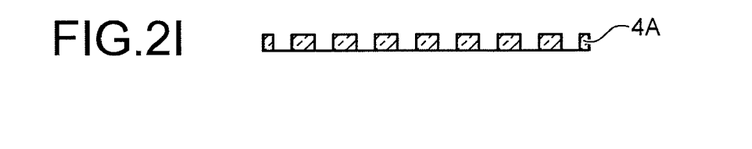

After performing the whole image exposure from the upper surface side of the diffraction pattern 1C, the diffraction pattern 1C is removed. Moreover, the development and the PEB are performed. Whereby, as shown in FIG. 2H, only the resist pattern 3A remains and the removing pattern 3B is removed. Thereafter, the pattern forming layer 4X is etched with the resist pattern 3A after the development as a mask, and as shown in FIG. 2I, a desired pattern (post-etching pattern 4A) is formed.

It is applicable to laminate an intermediate layer between the resist layer 3X and the second resist layer 1X. The intermediate layer is a film for controlling (adjusting) a distance between the resist layer 3X and the diffraction pattern 1C. When the intermediate layer is laminated between the resist layer 3X and the second resist layer 1X, the diffraction pattern 1C and the intermediate layer are removed after performing the whole image exposure on the diffraction pattern 1C.

In the present embodiment, a mask pattern that is formed on a mask for arranging or forming the diffraction pattern 1C is corrected based on the whole-image-exposure optical image intensity distribution obtained by an approximate model such as the multimode waveguide analysis, the fractional FFT, or the like. Specifically, the pattern shape of the diffraction pattern 1C to be arranged on a wafer is determined in advance based on the optical image intensity distribution in the resist layer 3X and the pattern shape of the resist pattern 3A. In other words, the shape and the dimension of the diffraction pattern 1C are determined so that a circuit layout matches the shape of the post-etching pattern 4A to be formed on the wafer, and the mask pattern (including a template pattern) is corrected so that the diffraction pattern 1C can be formed by photolithography, an imprint method, or the sidewall process.

For example, the post-etching pattern 4A depends on a resist film (such as the intermediate layer) formed on the upper portion of the resist layer 3X on which the resist pattern 3A is formed or the upper layer side of the resist layer 3X, a laminated condition of the pattern forming layer 4X, an exposure light wavelength used in the whole image exposure, an optical constant of a laminated film (such as the resist layer 3X and the intermediate layer) at the exposure light wavelength, and the like. Moreover, the post-etching pattern 4A depends also on the pattern shape (such as a pattern pitch p to be described later) of the diffraction pattern 1C. In the present embodiment, the mask pattern to be used in formation of the diffraction pattern 1C is corrected in advance so that the optical image intensity distribution in the resist layer 3X becomes the optical image intensity distribution with which the post-etching pattern 4A (desired layout) can be formed. Whereby, a desired post-etching pattern 4A can be formed by the whole image exposure. This correction method can be applied to the case of generating the mask pattern corresponding to the diffraction pattern 1C that is exposed by the whole image exposure and is formed in advance on the upper layer side of a wafer and the case of improving resolution of the resist pattern 3A that is formed by the whole image exposure.

Figure 3:
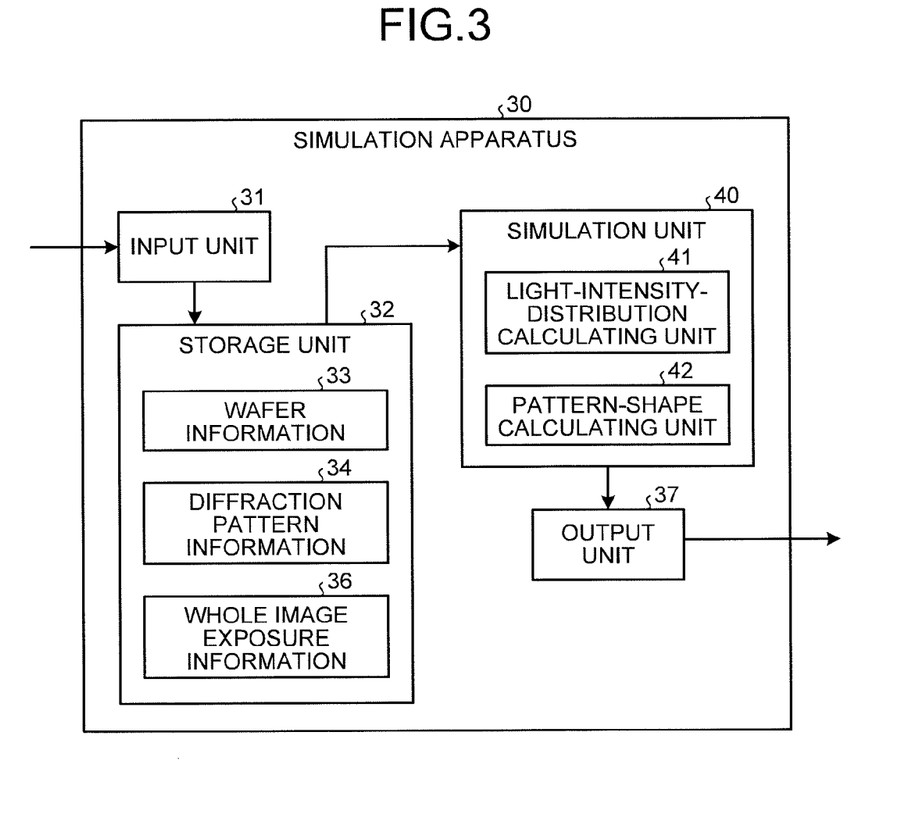
FIG. 3 is a block diagram illustrating a configuration of a simulation apparatus.

FIG. 3 is a block diagram illustrating a configuration of a simulation apparatus. A simulation apparatus 30 is, for example, a computer that simulates the pattern shape of the resist pattern 3A to be formed when the whole image exposure is performed from above the diffraction pattern 1C by the multimode waveguide analysis or the fractional FFT.

The simulation apparatus 30 includes an input unit 31, a storage unit 32, a simulation unit 40, and an output unit 37. The input unit 31 inputs various information and the like to be stored in the storage unit 32 from an external device or the like and sends it to the storage unit 32. The storage unit 32 is, for example, a memory that stores therein wafer information 33, diffraction pattern information 34, whole image exposure information 36, and the like as information sent from the input unit 31.

The wafer information 33 is information on a wafer subjected to the whole image exposure, and is, for example, information on an arrangement position (distance in a thickness direction from the diffraction pattern 1C) of the resist layer 3X. The diffraction pattern information 34 is information on the diffraction pattern 1C and is, for example, a layout and a thickness of the diffraction pattern 1C. The whole image exposure information 36 is information on a condition of the whole image exposure and is, for example, a value of a wavelength used in the whole image exposure and an optical constant of an upper layer film at this wavelength.

The simulation unit 40 includes a light-intensity-distribution calculating unit 41 and a pattern-shape calculating unit 42. The light-intensity-distribution calculating unit 41 calculates the optical image intensity distribution in the resist layer 3X when the whole image exposure is performed by using the diffraction pattern 1C with the wafer information 33, the diffraction pattern information 34, the whole image exposure information 36, and the like stored in the storage unit 32. The light-intensity-distribution calculating unit 41 in the present embodiment calculates the light intensity distribution by using the multimode waveguide analysis method or the fractional FFT and various expressions and parameters necessary for calculating the optical image intensity distribution formed in the resist layer 3X. The pattern-shape calculating unit 42 derives (calculates) the pattern shape of the resist pattern 3A by using the calculation result of the optical image intensity distribution and the like. The pattern-shape calculating unit 42 can calculate the pattern shape of the post-etching pattern 4A by using the calculated pattern shape of the resist pattern 3A and the like. The output unit 37 outputs the pattern shape of the resist pattern 3A calculated by the simulation unit 40 to the outside.

It is applicable that the simulation apparatus 30 does not include the pattern-shape calculating unit 42. In this case, the simulation apparatus 30 calculates the light intensity distribution formed in the resist layer 3X by the light-intensity-distribution calculating unit 41. Then, the pattern shape of the resist pattern 3A corresponding to the optical image intensity distribution is calculated by an apparatus (pattern-shape calculating apparatus) other than the simulation apparatus 30.

Figure 4:
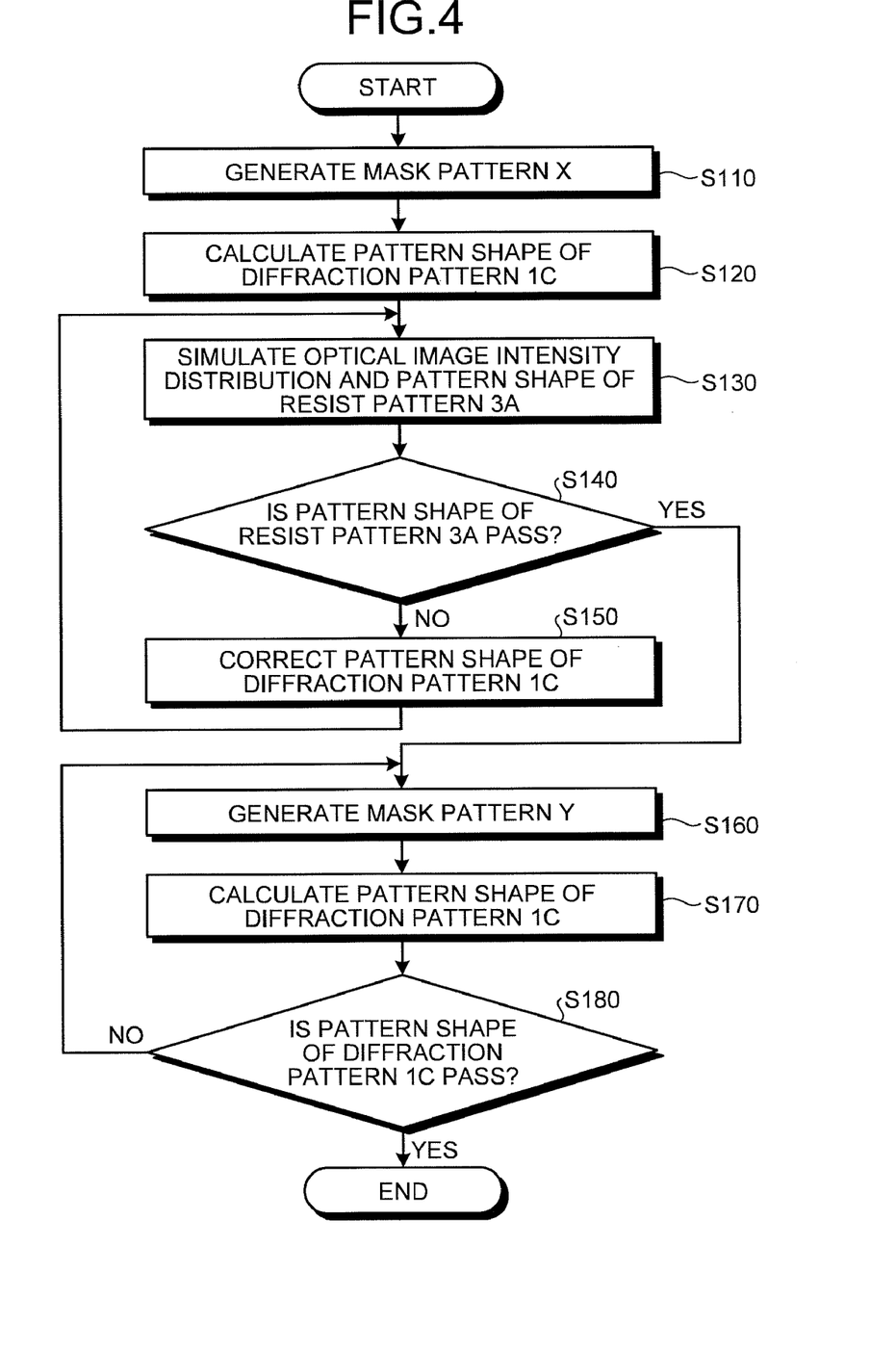
FIG. 4 is a flowchart illustrating a correction process procedure of a mask pattern.

Next, a correction process procedure of the mask pattern used in the pattern formation of the diffraction pattern 1C is explained. FIG. 4 is a flowchart illustrating the correction process procedure of the mask pattern. A generation apparatus of the mask pattern generates mask pattern data used for the pattern formation of the diffraction pattern 1C as a mask pattern X by using pattern data of the diffraction pattern 1C, design layout data of the diffraction pattern 1C, and the like (Step S110). This mask pattern X is pattern data that is temporarily generated by the generation apparatus of the mask pattern and is corrected as needed.

Next, the pattern shape of the diffraction pattern 1C is calculated by using the mask pattern X. The pattern shape of the diffraction pattern 1C is calculated by using the simulation apparatus or the like that performs simulation of a projection exposure (Step S120).

Thereafter, the simulation apparatus 30 simulates the pattern shape of the resist pattern 3A by applying the pattern shape of the diffraction pattern 1C on the multimode waveguide analysis method or the fractional FFT (Step S130). Specifically, the wafer information 33, the diffraction pattern information 34, the whole image exposure information 36, and the like are input to the input unit 31 of the simulation apparatus 30. The diffraction pattern information 34 in this example is information on the pattern shape of the resist pattern 3A calculated by simulation. The wafer information 33, the diffraction pattern information 34, the whole image exposure information 36, and the like input to the input unit 31 of the simulation apparatus 30 are stored in the storage unit 32.

The light-intensity-distribution calculating unit 41 of the simulation unit 40 refers to the wafer information 33, the diffraction pattern information 34, the whole image exposure information 36, and the like in the storage unit 32 and simulates the optical image intensity distribution in the resist layer 3X when the whole image exposure is performed by using the pattern pitch p of the diffraction pattern 1C and the like. The light-intensity-distribution calculating unit 41 in the present embodiment calculates the optical image intensity distribution by using the multimode waveguide analysis method or the fractional FFT. Then, the pattern-shape calculating unit 42 simulates the pattern shape of the resist pattern 3A by using the calculation result of the optical image intensity distribution, the wafer information 33 (arrangement position of the resist layer 3X in the thickness direction), and the like.

The simulation method of the optical image intensity distribution in the resist layer 3X is explained. First, explanation is given for the simulation method of the optical image intensity distribution in the resist layer 3X by using the fractional FFT.

In this example, explanation is given for the simulation method in the case where the resist layer 3X is assumed to have a one-dimensional pattern (L/S). Even if the resist layer 3X has a two-dimensional pattern, the optical image intensity distribution can be simulated by extending the following simulation method.

In the whole image exposure process, the whole image exposure is performed on a 1st pattern (the diffraction pattern 1C) formed on the substrate, whereby a diffraction image obtained by diffraction is formed in the resist layer 3X laminated on the lower layer side of the diffraction pattern 1C. For example, the intermediate film having a predetermined film thickness that is needed to obtain a diffraction light distribution corresponding to a desired pattern is laminated in advance between the diffraction pattern 1C and the resist layer 3X on the substrate layer.

The surface of the substrate is an X-Y plane, the film thickness direction of the diffraction pattern 1C and the like is a z axis, and the substrate surface (bottom surface of the diffraction pattern 1C) on which the diffraction pattern 1C on the substrate is formed is z=0, and the image forming surface (a desired position of the resist layer 3X in the thickness direction) of the resist layer 3X in which an optical image is formed is z=z'. At this time, when the condition of the following inequality (1) is satisfied, a diffracted light distribution obtained when the whole image exposure is performed on the diffraction pattern 1C can be approximated by ignoring three and higher order components. Therefore, it is possible to obtain a diffracted light distribution u'(x') by Fresnel diffraction formula of equation (2). In equation (2), x' is a coordinate of diffracted light.

$$z'^3 \gg \frac{1}{8\lambda}\left(\frac{p}{2}\right)^4 \quad (1)$$

$$u'(x') = \frac{i}{\lambda z'}\exp\left(-\frac{2i\pi}{\lambda}z'\right)\exp\left(-\frac{i\pi}{\lambda z'}x'^2\right)\int u(x)\exp\left(-\frac{i\pi}{\lambda z'}(x^2 - 2xx')\right)dx \quad (2)$$

When the coordinates of the image forming surface are projected as expression (3) and expression (4), an integral part in equation (2) is converted as expression (5). This integral equation after the conversion corresponds to an expression of the fractional FFT in Lohmann's type II optical system, so that high-speed calculation can be performed.

$$x' \rightarrow \frac{x'}{\cos\phi} \quad (3)$$

$$z' \rightarrow f\tan\phi \quad (4)$$

$$\int u(x)\exp\left(-\frac{i\pi}{\lambda z'}(x^2 - 2xx')\right)dx \rightarrow \quad (5)$$

$$\int u(x)\exp\left(-\frac{i\pi}{\lambda f\tan\phi}x^2 + \frac{2i\pi}{\lambda f\sin\phi}xx'\right)dx$$

Figure 5:
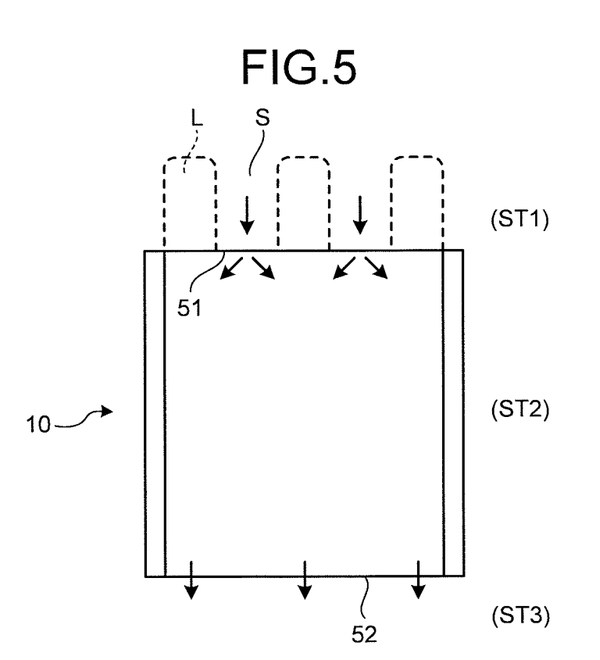
FIG. 5 is a diagram for explaining a simulation method of an optical image intensity distribution using a multimode waveguide analysis method.

Next, explanation is given for the simulation method of the optical image intensity distribution in the resist layer 3X using the multimode waveguide analysis method. FIG. 5 is a diagram for explaining the simulation method of the optical image intensity distribution using the multimode waveguide analysis method, and schematically illustrates the multimode waveguide analysis method.

An electric field distribution under the diffraction pattern 1C on the substrate is treated as a multimode interference coupler (MMI). At this time, a width w of a waveguide in the MMI is treated as w=p with respect to the pattern pitch p of the on-substrate pattern, so that the multimode waveguide analysis method can be applied. It is applicable to extend the simulation method using the multimode waveguide analysis method so that an optical image is calculated for both of a substrate condition in which the film thickness of the intermediate film is thinner than the above condition and a substrate condition in which the intermediate film is not provided.

The pattern pitch p is a distance obtained by summing up an inter-pattern distance (width of a space S) and a pattern width (width of a line L) on the substrate of the diffraction pattern 1C. In the multimode waveguide analysis method, a waveguide entrance opening 51 of a multimode waveguide 10 that is the MMI corresponds to the space S and the optical image intensity distribution at a waveguide exit opening 52 becomes the optical image intensity distribution in the resist layer 3X.

The exposure light with which the whole image exposure is performed on the diffraction pattern 1C passes through the space S of the diffraction pattern 1C and is emitted to the lower layer side (the intermediate film or the resist layer 3X). This phenomenon corresponds to that the exposure light enters the waveguide entrance opening 51 (width w of the waveguide) (ST1) in the multimode waveguide analysis method.

The exposure light that passes through the space S of the diffraction pattern 1C and is emitted to the lower layer side interferes on the lower layer side. This phenomenon corresponds to that the exposure light interferes in the multimode waveguide 10 (ST2) in the multimode waveguide analysis method.

The exposure light that interferes on the lower layer side is emitted to the resist layer 3X to become a predetermined optical image intensity distribution in the resist layer 3X. This phenomenon corresponds to that the exposure light exits to the waveguide exit opening 52 (out of the waveguide) (ST3) in the multimode waveguide analysis method. Therefore, the optical image intensity distribution of the exposure light that exits to the waveguide exit opening 52 becomes the optical image intensity distribution in the resist layer 3X.

In the present embodiment, each of the above phenomena is applied to the multimode waveguide analysis method and the optical image intensity distribution in the resist layer 3X is calculated. For example, when a TE wave is considered as an optical image under the one-dimensional pattern, a component of an electric field satisfies the relationship of equation (6).

$$\frac{\partial^2 E_y}{\partial x^2} + \frac{\partial^2 E_y}{\partial z^2} + k_0^2 n^2 E_y = 0 \quad (6)$$

In equation (6), Ey is a y direction component of the electric field and $k_0$ is the number of waves. Moreover, in equation (6), n is a refractive index of a medium. At this time, mode propagation characteristics in a z direction in a mode $j\phi_j$ of order j are $\exp(-i\beta_j z)$ by using a mode propagation constant $\beta_j$ of order j and $\beta_j$ can be approximately treated as equation (7).

$$\beta_j = k_0 n - \left\{\frac{(j+1)\pi}{w}\right\}^2 \frac{1}{2k_0 n} \quad (7)$$

Moreover, the difference in a propagation constant between modes is expressed by equation (8) and equation (9). In equation (8) and equation (9), Lc is an inverse of the difference in the propagation constant between a zeroth-order propagation mode and a first-order propagation mode.

$$\beta_0 - \beta_j = \frac{j(j+2)\pi}{3L_c} \quad (8)$$

$$L_c = \frac{2k_0 n w^2}{3\pi} \quad (9)$$

With the above equation (6) to equation (9), an optical image at a depth position z from the substrate surface can be calculated by an expansion of equation (10).

$$E_y(x, z) = \sum_j c_j \phi_j(x) \exp\left(i\frac{j(j+2)\pi}{3L_c}z\right) \exp(-i\beta_0 z) \quad (10)$$

In this manner, in equation (10), Ey(x,z) is expressed by an expression in which Lc is used, and Lc is expressed by an expression in which the width w (pattern pitch p on the substrate of the diffraction pattern 1C) of the waveguide is used as shown in equation (9). Therefore, the simulation method of the optical image intensity distribution in the resist layer 3X using the multimode waveguide analysis method is the multimode waveguide analysis method using the pattern pitch p of the diffraction pattern 1C.

The output unit 37 outputs the pattern shape of the resist pattern 3A calculated by the pattern-shape calculating unit 42 to the outside. Thereafter, a pattern determining apparatus such as a computer compares the pattern shape of the resist pattern 3A generated by simulation with a desired resist pattern 3A. Whereby, the pattern determining apparatus determines whether the pattern shape of the resist pattern 3A generated by using the mask pattern X is a desired pattern shape (pass) (Step S140). The pattern determining apparatus in this example stores therein the pattern shape of the resist pattern 3A that needs to be formed on a wafer in advance. Then, the pattern determining apparatus compares the stored pattern shape with the generated pattern shape of the resist pattern 3A to determine whether the generated pattern shape of the resist pattern 3A is the desired pattern shape.

When the pattern shape of the resist pattern 3A generated by using the mask pattern X is not the desired pattern shape (NO at Step S140), the pattern shape of the resist pattern 3A (the diffraction pattern 1C) is corrected by the correction apparatus of pattern shape data, the generation apparatus of the pattern shape data, and the like (Step S150).

Thereafter, the processes from Step S120 to Step S150 are repeated until the pattern shape of the resist pattern 3A generated by using the mask pattern X becomes the desired pattern shape. In other words, the simulation apparatus 30 simulates the pattern shape of the resist pattern 3A by using the pattern shape after the correction of the diffraction pattern 1C (Step S130). Moreover, the pattern determining apparatus determines whether the pattern shape of the resist pattern 3A generated by using the diffraction pattern 1C after the correction is the desired pattern shape (Step S140). When the pattern shape after the correction of the resist pattern 3A is the desired pattern shape (YES at Step S140), the generation apparatus of the mask pattern generates the mask pattern used for the pattern formation of the diffraction pattern 1C as a mask pattern Y by using the pattern shape after the correction of the resist pattern 3A (Step S160). Specifically, the mask pattern is corrected so that the diffraction pattern 1C and the resist pattern 3A can be formed as desired.

Thereafter, the simulation apparatus 30 simulates the pattern shape of the diffraction pattern 1C by using the mask pattern Y (Step S170). Moreover, the pattern determining apparatus determines whether the pattern shape of the diffraction pattern 1C generated by simulation is the desired pattern shape (pass) (Step S180).

When the pattern shape of the diffraction pattern 1C is not the desired pattern shape (NO at Step S180), the generation apparatus of the mask pattern reproduces (corrects) the mask pattern Y (Step S160). Then, the simulation apparatus 30 simulates the pattern shape of the diffraction pattern 1C by using the mask pattern Y after the correction (Step S170), and the pattern determining apparatus determines whether the pattern shape of the diffraction pattern 1C generated by simulation is the desired pattern shape (Step S180).

Thereafter, the processes at Step S180, Step S160, and Step S170 are repeated until the pattern shape of the diffraction pattern 1C becomes the desired pattern shape. When it is determined that the pattern shape of the diffraction pattern 1C becomes the desired pattern shape (YES at Step S180), the generation process of the mask pattern ends.

The calculation process of the optical image intensity distribution by the simulation apparatus 30 and the pattern shape calculating process of the resist pattern 3A are performed, for example, for each layer of a wafer process. In each layer, the mask pattern is changed as needed and the exposure process is performed on a wafer by using the changed mask pattern. Specifically, the wafer is exposed from above the second resist layer 1X via the mask in which the mask pattern is changed, whereby the diffraction pattern 1C is formed. Then, the whole image exposure is performed on the wafer from above the diffraction pattern 10, and thereafter the development process is performed to form the resist pattern 3A.

Moreover, a process target film arranged on the lower layer side of the resist pattern 3A is processed (such as etching process) with the resist pattern 3A as a mask to form a desired post-etching pattern 4A. When producing (manufacturing) a semiconductor device (semiconductor integrated circuit), the above described calculation process of the optical image intensity distribution, pattern shape calculating process of the post-etching pattern 4A, correction process of the mask pattern, formation process of the diffraction pattern 1C by using the corrected mask pattern, whole-image-exposure process by using the diffraction pattern 1C, development process, etching process in which the resist pattern 3A is used as a mask, and the like are repeated for each layer.

Figure 6:
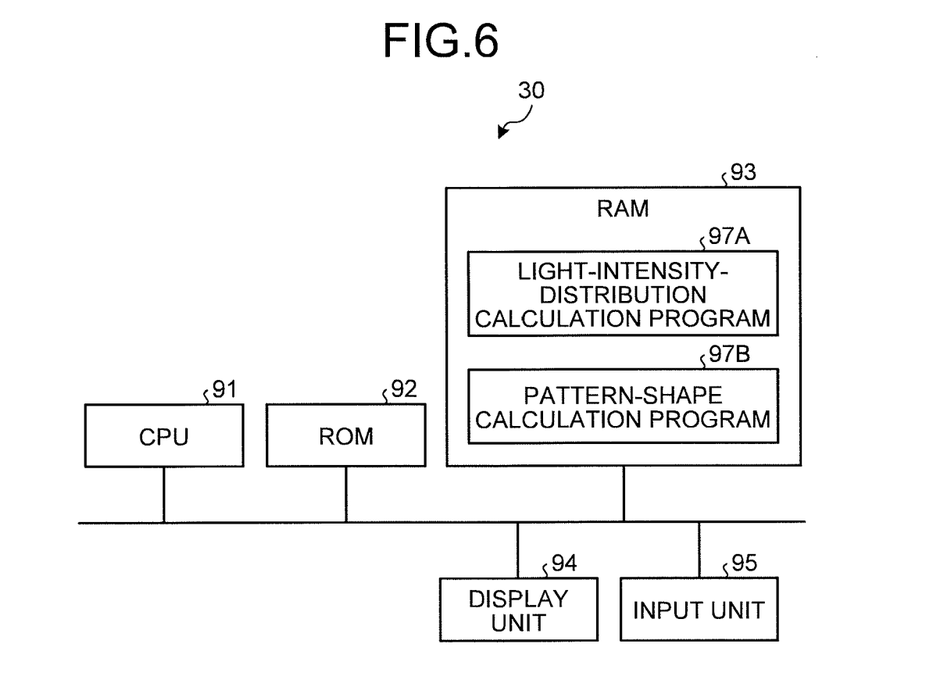
FIG. 6 is a diagram illustrating a hardware configuration of the simulation apparatus.

Next, a hardware configuration of the simulation apparatus 30 is explained. FIG. 6 is a diagram illustrating the hardware configuration of the simulation apparatus. The simulation apparatus 30 includes a CPU (Central Processing Unit) 91, a ROM (Read Only Memory) 92, a RAM (Random Access Memory) 93, a display unit 94, and an input unit 95. In the simulation apparatus 30, the CPU 91, the ROM 92, the RAM 93, the display unit 94, and the input unit 95 are connected via a bus line.

The CPU 91 calculates the optical image intensity distribution in the resist layer 3X by using a light-intensity-distribution calculation program 97A that is a computer program. Moreover, the CPU 91 calculates the pattern shape of the post-etching pattern 4A corresponding to the optical image intensity distribution by using a pattern-shape calculation program 97B that is a computer program.

The display unit 94 is a display device such as a liquid crystal monitor, and displays the wafer information 33, the diffraction pattern information 34, the whole image exposure information 36, the optical image intensity distribution, the pattern shape of the post-etching pattern 4A corresponding to the optical image intensity distribution, and the like based on an instruction from the CPU 91.

The input unit 95 includes a mouse and a keyboard, and inputs instruction information (such as parameter necessary for calculating the optical image intensity distribution) that is externally input by a user, the wafer information 33, the diffraction pattern information 34, and the whole image exposure information 36. The instruction information input to the input unit 95 is sent to the CPU 91. The wafer information 33, the diffraction pattern information 34, and the whole image exposure information 36 are stored in the simulation apparatus 30 as the ROM 92 or stored in the RAM 93.

The light-intensity-distribution calculation program 97A and the pattern-shape calculation program 97B are stored in the ROM 92 and are loaded in the RAM 93 via the bus line. FIG. 6 illustrates a state where the light-intensity-distribution calculation program 97A and the pattern-shape calculation program 97B are loaded in the RAM 93.

The CPU 91 executes the light-intensity-distribution calculation program 97A and the pattern-shape calculation program 97B loaded in the RAM 93. Specifically, in the simulation apparatus 30, the CPU 91 reads out the light-intensity-distribution calculation program 97A and the pattern-shape calculation program 97B from the ROM 92, loads them in a program storage area in the RAM 93, and executes various processes, in accordance with the input of an instruction by a user from the input unit 95. The CPU 91 temporarily stores various data generated in the various processes in a data storage area formed in the RAM 93.

The light-intensity-distribution calculation program 97A and the pattern-shape calculation program 97B executed in the simulation apparatus 30 have module configurations including the light-intensity-distribution calculating unit 41 and the pattern-shape calculating unit 42, respectively. The light-intensity-distribution calculating unit 41 and the pattern-shape calculating unit 42 are loaded in a main storage device to be generated on the main storage device.

In the present embodiment, it is determined whether the pattern shape of the resist pattern 3A generated by using the mask pattern X is a desired pattern shape; however, it is applicable to determine whether the post-etching pattern 4A generated by using the mask pattern X is a desired pattern shape. In this case, the pattern determining apparatus compares the pattern shape of the post-etching pattern 4A generated by simulation using the resist pattern 3A with a desired post-etching pattern 4A. Then, the pattern determining apparatus determines whether the pattern shape of the post-etching pattern 4A generated by using the mask pattern X is a desired pattern shape.

Moreover, it is applicable that the simulation apparatus 30 is configured to include functions of the apparatuses explained in the present embodiment such as the pattern determining apparatus and the generation apparatus of the mask pattern.

In the present embodiment, the case is explained in which the optical image intensity distribution of the resist layer 3X is calculated by using the multimode waveguide analysis model or the fractional FFT with respect to the diffraction pattern 1C; however, the optical image intensity distribution can be calculated by using a design pattern of the diffraction pattern 1C. Moreover, it is applicable that the diffraction pattern 1C is primarily determined by simulation and the optical image intensity distribution is simulated by using the determined diffraction pattern 1C.

Moreover, in the present embodiment, the case is explained in which when the pattern shape of the resist pattern 3A generated by simulation is not a desired shape pattern, the pattern shape of the resist pattern 3A is corrected; however, the correction target is not limited to the pattern shape of the resist pattern 3A. For example, it is inspected whether the optical image intensity distribution calculated by using the multimode waveguide analysis model or the fractional FFT with respect to the diffraction pattern 1C satisfies a desired condition. Then, when it is determined that the desired condition is not satisfied as a result of the inspection, a mask pattern or a template pattern formed on a mask or a template used when forming the diffraction pattern 1C by using the lithography or the imprint method can be corrected.

In this manner, according to the embodiment, the optical image intensity distribution formed on the resist layer when performing the whole image exposure from above the diffraction pattern is derived by using the multimode waveguide analysis method or the fractional FFT, so that a shape of a pattern formed by using the whole image exposure can be simulated correctly in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of calculating an optical image intensity comprising calculating an optical image intensity distribution to be formed in a resist arranged on a lower layer side of a diffraction pattern by performing a whole image exposure from an upper surface side of the diffraction pattern formed on a substrate, by using a multimode waveguide analysis model or a fractional Fourier transform with respect to the diffraction pattern.

2. The method according to claim 1, wherein the calculating the optical image intensity distribution is performed by using a pattern pitch of the diffraction pattern.

3. The method according to claim 1, wherein the calculating the optical image intensity distribution is performed based on at least one of information on the substrate on which the whole image exposure is performed, information on the diffraction pattern, and information on a condition of the whole image exposure.

4. The method according to claim 3, wherein the information on the substrate on which the whole image exposure is performed includes information on a distance in a thickness direction of the resist from the diffraction pattern.

5. The method according to claim 3, wherein the information on the diffraction pattern includes information on a layout of the diffraction pattern and information on a thickness of the diffraction pattern.

6. The method according to claim 3, wherein the information on the condition of the whole image exposure includes a value of a wavelength used in the whole image exposure and an optical constant of the resist at the wavelength.

7. The method according to claim 6, further comprising laminating an intermediate film having a predetermined film thickness determined to obtain a desired optical image intensity distribution between the diffraction pattern and the resist, wherein
the information on the condition of the whole image exposure includes an optical constant of the intermediate film at the wavelength.

8. The method according to claim 1, wherein the calculating the optical image intensity distribution is performed by using a design pattern of the diffraction pattern.

9. A method of generating a pattern comprising:
calculating an optical image intensity distribution formed in a resist arranged on a lower layer side of a diffraction pattern by performing a whole image exposure from an upper surface side of the diffraction pattern formed on a substrate by using a lithography or an imprint, by using a multimode waveguide analysis model or a fractional Fourier transform with respect to the diffraction pattern;
inspecting whether calculated optical image intensity distribution satisfies a desired condition; and
generating, when it is determined that the optical image intensity distribution does not satisfy the desired condition based on a result of the inspection, a pattern used in formation of the diffraction pattern by correcting a pattern of a mask or a template used when forming the diffraction pattern by using the lithography or the imprint.

10. The method according to claim 9, wherein the calculating the optical image intensity distribution is performed by using a pattern pitch of the diffraction pattern.

11. The method according to claim 9, wherein the calculating the optical image intensity distribution is performed based on at least one of information on the substrate on which the whole image exposure is performed, information on the diffraction pattern, and information on a condition of the whole image exposure.

12. The method according to claim 11, wherein the information on the substrate on which the whole image exposure is performed includes information on a distance in a thickness direction of the resist from the diffraction pattern.

13. The method according to claim 11, wherein the information on the diffraction pattern includes information on a layout of the diffraction pattern and information on a thickness of the diffraction pattern.

14. The method according to claim 11, wherein the information on the condition of the whole image exposure includes a value of a wavelength used in the whole image exposure and an optical constant of the resist at the wavelength.

15. The method according to claim 14, further comprising laminating an intermediate film having a predetermined film thickness determined to obtain a desired optical image intensity distribution between the diffraction pattern and the resist, wherein the information on the condition of the whole image exposure includes an optical constant of the intermediate film at the wavelength.

16. The method according to claim 9, wherein the calculating the optical image intensity distribution is performed by using a design pattern of the diffraction pattern.

17. A method of manufacturing a semiconductor device comprising:
calculating an optical image intensity distribution to be formed in a resist arranged on a lower layer side of a diffraction pattern by performing a whole image exposure from an upper surface side of the diffraction pattern formed on a substrate by using a lithography or an imprint method, by using a multimode waveguide analysis model or a fractional Fourier transform with respect to the diffraction pattern;
inspecting whether calculated optical image intensity distribution satisfies a desired condition;
generating, when it is determined that the optical image intensity distribution does not satisfy the desired condition based on a result of the inspection, a pattern used in formation of the diffraction pattern by correcting a pattern of a mask or a template used when forming the diffraction pattern by using the lithography or the imprint;
forming a diffraction pattern on the substrate by the lithography or the imprint in which a mask or a template manufactured based on generated pattern is used;
performing the whole image exposure on the resist arranged on a lower layer side of the diffraction pattern via the diffraction pattern;
forming a resist pattern by developing the resist; and
processing a process target film arranged on a lower layer side of the resist pattern with the resist pattern as a mask.

18. The method according to claim 17, wherein the calculating the optical image intensity distribution is performed by using a pattern pitch of the diffraction pattern.

19. The method according to claim 17, wherein the calculating the optical image intensity distribution is performed based on at least one of information on the substrate on which the whole image exposure is performed, information on the diffraction pattern, and information on a condition of the whole image exposure.

20. The method according to claim 19, wherein the information on the substrate on which the whole image exposure is performed includes information on a distance in a thickness direction of the resist from the diffraction pattern.

* * * * *